US011807536B2

United States Patent
Xia et al.

(10) Patent No.: US 11,807,536 B2
(45) Date of Patent: Nov. 7, 2023

(54) METHOD FOR PREPARING GRAPHITE SHEETS WITH PIERCING TREATMENT TO ENHANCE THERMAL CONDUCTION

(71) Applicant: INDIUM CORPORATION, Utica, NY (US)

(72) Inventors: Hongtao Xia, Jiangsu (CN); Fen Chen, Jiangsu (CN); Ning-Cheng Lee, New Hartford, NY (US)

(73) Assignee: INDIUM CORPORATION, Utica, NY (US)

( * ) Notice: Subject to any disclaimer, the term of this patent is extended or adjusted under 35 U.S.C. 154(b) by 0 days.

(21) Appl. No.: 16/977,699

(22) PCT Filed: Mar. 13, 2020

(86) PCT No.: PCT/CN2020/079103
§ 371 (c)(1),
(2) Date: Sep. 2, 2020

(87) PCT Pub. No.: WO2021/179275
PCT Pub. Date: Sep. 16, 2021

(65) Prior Publication Data
US 2023/0033918 A1    Feb. 2, 2023

(51) Int. Cl.
*B05D 3/00* (2006.01)
*C01B 32/225* (2017.01)
(Continued)

(52) U.S. Cl.
CPC ............ *C01B 32/225* (2017.08); *B05D 3/002* (2013.01); *B05D 3/12* (2013.01); *B26F 1/24* (2013.01);
(Continued)

(58) Field of Classification Search
CPC . B05D 3/002; B05D 3/12; B05D 1/18; B05D 2252/02; B05D 2252/10;
(Continued)

(56) References Cited

U.S. PATENT DOCUMENTS 6,506,484 B1 *   1/2003   Mercuri ................ C04B 35/536
                                                                429/514
2019/0144286 A1   5/2019   Won et al.

FOREIGN PATENT DOCUMENTS

CA        2429780        12/2003
WO    WO 2004/004033      1/2004
(Continued)

OTHER PUBLICATIONS

Zhang et al., "High-performance thermal interface materials consisting of vertically aligned graphene film and polymer", Carbon 109 (2016), pp. 552-557.
(Continued)

*Primary Examiner* — Hai Y Zhang
(74) *Attorney, Agent, or Firm* — Sheppard, Mullin, Richter & Hampton LLP (57) ABSTRACT

Some implementations of the disclosure are directed to a method, comprising: receiving a sheet of graphite comprising a first surface and a second surface opposite the first surface; and perforating the sheet in a first plurality of locations from the first surface through the second surface to form a first plurality of perforations through the sheet and a first plurality of protrusions of the graphite oriented outward from the second surface, the first plurality of protrusions configured to conduct heat away from a plane of the sheet. Further implementations comprise perforating the sheet in a second plurality of locations from the second surface through the first surface to form a second plurality of perforations through the sheet and a second plurality of protrusions of graphite material oriented outward from the
(Continued)

first surface, wherein the second plurality of protrusions are configured to conduct heat away from the plane of the sheet.

10 Claims, 6 Drawing Sheets (51) Int. Cl.
*C01B 32/205* (2017.01)
*B32B 3/26* (2006.01)
*B32B 9/00* (2006.01)
*B26F 1/24* (2006.01)
*B05D 3/12* (2006.01)
*H01L 23/373* (2006.01)
*C23C 2/02* (2006.01)
*C23C 2/04* (2006.01)
*C23C 2/40* (2006.01)
*B05D 1/18* (2006.01)

(52) U.S. Cl.
CPC .............. *B32B 3/266* (2013.01); *B32B 9/007* (2013.01); *C01B 32/205* (2017.08); *C23C 2/02* (2013.01); *C23C 2/04* (2013.01); *C23C 2/40* (2013.01); *H01L 23/373* (2013.01); *B05D 1/18* (2013.01); *B05D 2252/02* (2013.01); *B05D 2252/10* (2013.01); *B32B 2255/205* (2013.01); *B32B 2255/26* (2013.01)

(58) Field of Classification Search
CPC . B26F 1/24; B32B 3/266; B32B 9/007; B32B 2255/205; B32B 2255/26; C23C 2/02; C23C 2/04; C23C 2/40; H01L 23/373
See application file for complete search history.

(56) References Cited

FOREIGN PATENT DOCUMENTS

| WO | WO-2004004033 A1 * | 1/2004 | .......... H01M 4/8892 |
| WO | WO 2015/045700 | 4/2015 | |
| WO | WO 2017/179619 | 2/2019 | |

OTHER PUBLICATIONS

International Search Report and Written Opinion dated Dec. 10, 2020 for PCT/CN2020/079103, filed Mar. 13, 2020.

* cited by examiner

METHOD FOR PREPARING GRAPHITE SHEETS WITH PIERCING TREATMENT TO ENHANCE THERMAL CONDUCTION

Reference to Related Application

The present application is a U.S. national phase of and claims priority to PCT International Patent Application No. PCT/CN2020/079103, filed Mar. 13, 2020 and titled "METHOD FOR PREPARING GRAPHITE SHEETS WITH PIERCING TREATMENT TO ENHANCE THERMAL CONDUCTION," which is incorporated herein by reference in its entirety.

Description of the Related Art

As the power density of microelectronic devices continues to increase, more heat is generated, making effective heat dissipation an important factor in designing microelectronic devices. As such, an important factor in the performance of electronic assemblies is thermal management via a thermal interface material (TIM). TIMs may provide a heat transfer medium between a heat source and a heat spreader or heat sink. A TIM may be a key component to ensure stable and reliable heat dissipation of an electronic assembly.

TIMs that have been used in the past include thermal greases, thermal gels, solders (e.g., solder preforms or liquid solders), thermal conductive adhesives, and phase-changing materials. Although thermal greases have been widely available on the market as a TIM due to their good thermal performance upon installation, upon extended use and over time, these greases can degrade, resulting in higher thermal resistance at the interface. This impairs the transfer of heat away from the semiconductor device. This problem has been attributed, in part, to "pump-out." The powering up and down of the devices causes a relative motion between the die and the heat-spreader due to their different coefficients of thermal expansion. This can tend to "pump" out the paste from the interface gap. Accordingly, where reliability is critical, the pump out problem of thermal greases is a major downside.

One issue with using traditional solders as a TIM is that they require both soldering surfaces (e.g., between heat source and heat spreader) to be metallized and solderable, which increases the cost of manufacturing. Additionally, when attaching a heat sink package, soldering may not be feasible because of the solder's large thermal mass. Accordingly, solder may not be useable for certain TIM applications.

Thermal conductive adhesives or thermal gels generally have a low thermal conductivity, which prevents a major a limitation that makes them unfavored as TIMs. Phase change materials are generally limited in their heat capacity, and therefore are not favored for devices that generate significant amounts of heat.

Brief Summary of Embodiments

Some implementations of the disclosure are directed to techniques for preparing a graphite sheet to redirect the high thermal conductivity of the graphite to a direction that is away from the sheet plane.

In one embodiment, a method comprises: receiving a sheet of graphite comprising a first surface and a second surface opposite the first surface; and perforating the sheet in a first plurality of locations from the first surface through the second surface to form a first plurality of perforations through the sheet and a first plurality of protrusions of the graphite oriented outward from the second surface, wherein the first plurality of perforations are configured to conduct heat away from a plane of the sheet. In some implementations, perforating the sheet in the first plurality of locations comprises perforating the sheet in the first plurality of locations with a bed of spikes or a spiked roller.

In some implementations, the method further comprises: perforating the sheet in a second plurality of locations from the second surface through the first surface to form a second plurality of perforations through the sheet and a second plurality of protrusions of graphite material oriented outward from the first surface, wherein the second plurality of protrusions are configured to conduct heat away from the plane of the sheet.

In some implementations, perforating the sheet in the first plurality of locations comprises perforating the sheet in the first plurality of locations with a bed of spikes; and wherein perforating the sheet in the second plurality of locations comprises perforating the sheet in the second plurality of locations with a bed of spikes. In some implementations, the bed of spikes used to perforate the sheet in the first plurality of locations is the same as the bed of spikes used to perforate the sheet in the second plurality of locations.

In some implementations, perforating the sheet in the first plurality of locations comprises perforating the sheet in the first plurality of locations with a first spiked roller; and wherein perforating the sheet in the second plurality of locations comprises perforating the sheet in the second plurality of locations with a second spiked roller. In some implementations, receiving the sheet comprises loading the sheet on a conveyer; wherein perforating the sheet in the first plurality of locations with the first spiked roller comprises conveying the sheet between the first spiked roller and a first non- spiked roller; and wherein perforating the sheet in the second plurality of locations with the second spiked roller comprises conveying the sheet between the second spiked roller and a second non-spiked roller.

In some implementations, the first non-spiked roller and the second non-spiked roller each comprise a surface rubber layer. In some implementations, the method further comprises: after conveying the sheet between the second spiked roller and the second non-spiked roller: conveying the sheet through a polymer bath to coat the sheet in a polymer; or conveying the sheet through a metal bath to plate the sheet with a metal or metal alloy.

In some implementations, the method further comprises: after perforating the sheet in the first plurality of locations, coating the sheet in a polymer. Coating the sheet in the polymer may comprise: placing the sheet in a polymer bath; drying the sheet after removing the sheet from the polymer bath; and curing the polymer after drying the sheet.

In some implementations, the method further comprises: after perforating the sheet in the first plurality of locations, plating the sheet with a solder. Plating the sheet with the solder may comprise: placing the sheet of graphite in a bath of a solder; rinsing the sheet after removing it from the bath; and drying the sheet after rinsing it.

In one embodiment, an assembly comprises: a heat generating device; a heat transferring device; and a sheet of graphite between surfaces of the heat generating device and the heat transferring device, wherein a first surface of the sheet is oriented to conduct heat from the heat generating device, and wherein a second surface of the sheet is oriented to conduct heat to the heat transferring device, wherein the sheet comprises: a first plurality of protrusions of the graphite oriented outward from the first surface along a first plurality of perforations in the sheet. In some implementations, the sheet further comprises: a second plurality of protrusions of the graphite oriented outward from the second surface along a second plurality of perforations in the sheet.

In some implementations, the sheet of graphite is plated by a solder. In some implementations, the sheet of graphite is coated by a polymer.

In some implementations, the heat generating assembly comprises a semiconductor die, and wherein the heat transferring assembly comprises a heat spreader. In some implementations, the heat transferring assembly comprises a heat sink.

In some implementations, the sheet of graphite is between 10 μm and 2000 μm thick.

In one embodiment, a sheet of graphite comprises: a first surface comprising: a first plurality of protrusions of the graphite oriented outward from the first surface along a first plurality of perforations in the sheet; and a second surface opposite the first surface, wherein the first plurality of protrusions are configured to conduct heat away from a plane of the sheet. In some implementations, the second surface comprises: a second plurality of protrusions of the graphite oriented outward from the second surface along a second plurality of perforations in the sheet, wherein the second plurality of protrusions of are configured to conduct heat away from a plane of the sheet, In some implementations, the sheet of graphite is coated with a polymer or plated with a solder.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations. Furthermore, it should be noted that for clarity and ease of illustration, the elements in the figures have not necessarily been drawn to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Figure 1A:
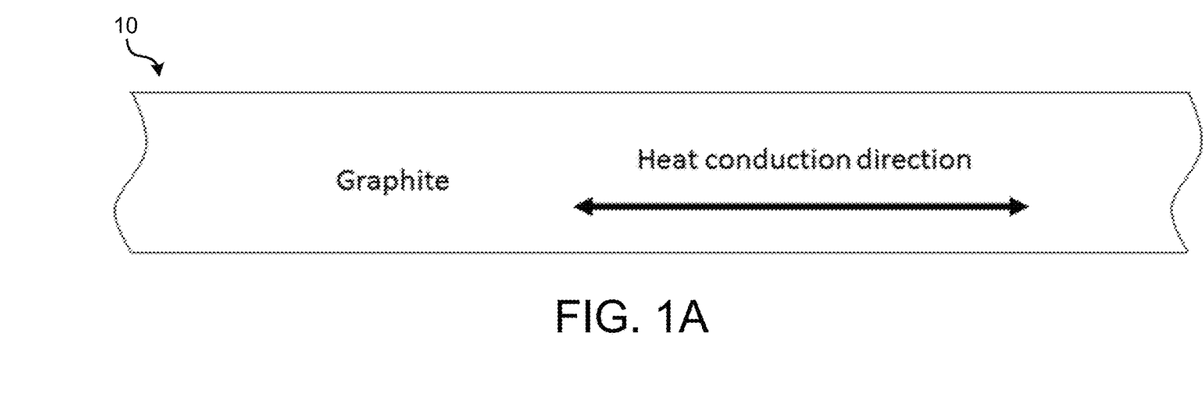
FIG. 1A illustrates a heat conduction direction of a cross-section of a sheet of graphite.

As discussed above, there is an ever increasing need for improved TIMs that provide a heat transfer medium in electronic assemblies, including microelectronic devices. Recently, graphite sheets have received some attention due to graphite's extremely high planar thermal conductivity (about 5000 W/(m·K)) and mechanical strength. However, a sheet of graphite may not provide good thermal conductivity in a direction away from (e.g., perpendicular to) the surface of the sheet. That is, the vertical thermal conductivity of the graphite sheet is usually far lower than its horizontal thermal conductivity along the sheet plane. This is illustrated by FIG. 1A, which illustrates a heat conduction direction of a cross-section of a sheet of graphite 10. As depicted, heat is conducted along the plane of the sheet of graphite.

To use a thin layer of graphite as a TIM for semiconductor packages, it may be very difficult to lay the graphite sheet vertically as a thin layer between a heat source and heat sink or heat spreader. More recently, a graphite composite has been fabricated by rolling graphite sheets into a vertically aligned roll of graphite film, followed by penetrating liquid polydimethylsiloxane (PDMS) into it, and then slicing the impregnated graphite roll into many thin films. However, it can be very difficult to cut the rolls into thin films. Accordingly, this use of graphite as a TIM may not be suitable for high volume electronics packaging applications.

To address the aforementioned deficiencies of TIMs, including graphite sheets, implementations of the disclosure are directed to techniques for preparing a graphite sheet or layer in a manner that redirects the high thermal conductivity of the graphite to a direction that is away from (e.g., substantially perpendicular to) the sheet plane. By virtue of implementing the techniques described herein, the graphite sheet may be formed as a thin layer of TIM between two surfaces that effectively conducts heat. For example, the graphite sheets described herein may be used to dissipate heat from a semiconductor die to a heat spreader and/or heat sink. As will be further appreciated from the foregoing discussion, by virtue of the graphite sheet forming techniques described herein having a relatively simple manufacturing process, the techniques described herein may be particularly suitable for mass production of graphite sheets as TIMs.

Figure 1B:
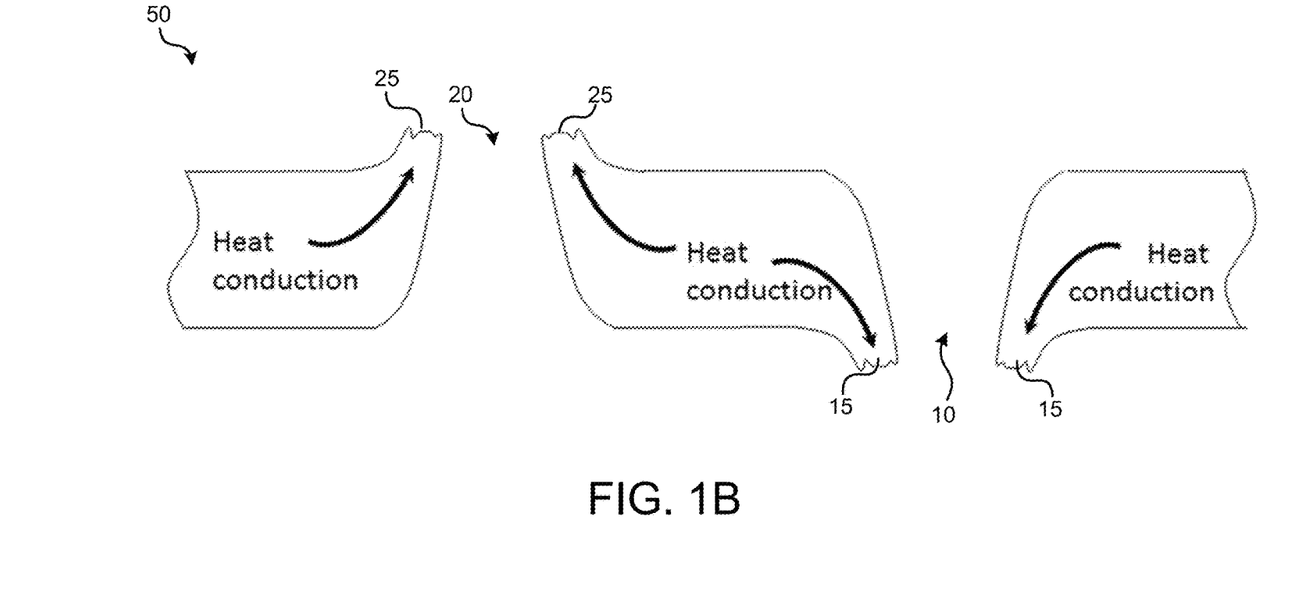
FIG. 1B illustrates a heat conduction direction of a cross-section of a sheet of graphite, processed in accordance with implementations of the disclosure.

FIG. 1B illustrates a heat conduction direction of a cross-section of a sheet of graphite 50, processed in accordance with implementations of the disclosure. As depicted, heat is conducted away from the plane of graphite sheet 50. In particular, protrusions 25 are configured to conduct heat in a direction away from a first surface (e.g., top surface) of the graphite sheet 50, and protrusions 15 are configured to conduct heat in a direction away from a second surface (e.g., bottom surface) of the graphite sheet 50. In contrast to graphite sheet 10, where most of the heat flows along the plane of graphite sheet 10, in graphite sheet 50 most of the heat flows away from the plane of the graphite sheet. The protrusions 15 and 25 may be formed as a consequence of forming perforations 10 and 20 via a process of perforating the graphite sheet 50 in a plurality of locations, both above and below the graphite sheet 50. Techniques for perforating a graphite sheet through one side, or through both sides, to form protrusions for conducting heating heat away from a plane of the graphite sheet are further described below.

Figure 2:
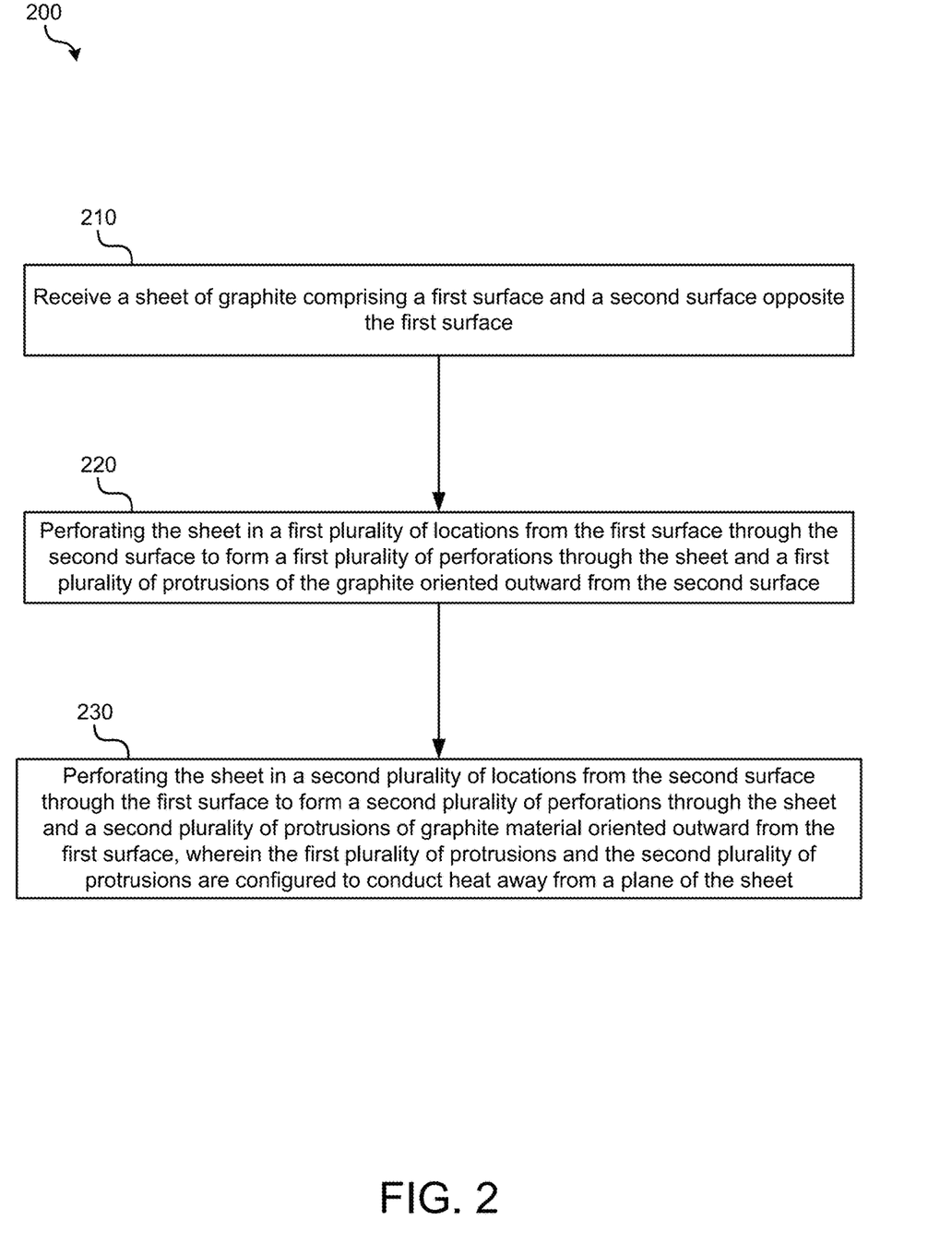
FIG. 2 is an operational flow diagram illustrating example steps of a method of processing a sheet of graphite to increase its thermal conductivity away from a plane of the sheet, in accordance with implementations of the disclosure.

FIG. 2 is an operational flow diagram illustrating example steps of a method 200 of processing a sheet of graphite to increase its thermal conductivity away from a plane of the sheet, in accordance with implementations of the disclosure. For example, thermal conductivity along a vertical axis perpendicular to the horizontal sheet plane may be improved. For illustration purposes, FIG. 2 will be described with reference to FIG. 3, which depicts one particular process and piercing assembly 300 for processing a graphite sheet 100. However, as should be appreciated from the disclosure, various other processes and/or assemblies may be utilized to form perforations in the sheet of graphite to increase thermal conductivity in a direction away from the sheet plane.

At operation 210, a sheet of graphite is received, the sheet of graphite comprising a first surface (e.g., top surface) and a second surface (e.g., bottom surface) opposite the first surface. In some implementations, the sheet of graphite may be between about 10 µm and 2000 µm thick. In particular implementations, the sheet of graphite may be between about 20 µm and 500 µm thick. In some implementations, the sheet of graphite may be loaded in a conveyer or other equipment to prepare it for processing. Prior to processing (e.g., prior to perforating it), the graphite sheet may primarily conduct heat along a plane of the sheet (e.g., as depicted in FIG. 1A).

At operation 220, the sheet of graphite is perforated in a first plurality of locations from the first surface through the second surface to form a first plurality of perforations through the sheet and a first plurality of protrusions of the graphite oriented outward from the second surface. As the sheet of graphite is perforated in one of the first locations, the graphite of that location may be pushed outward through the second surface to form protrusions.

Figure 3:
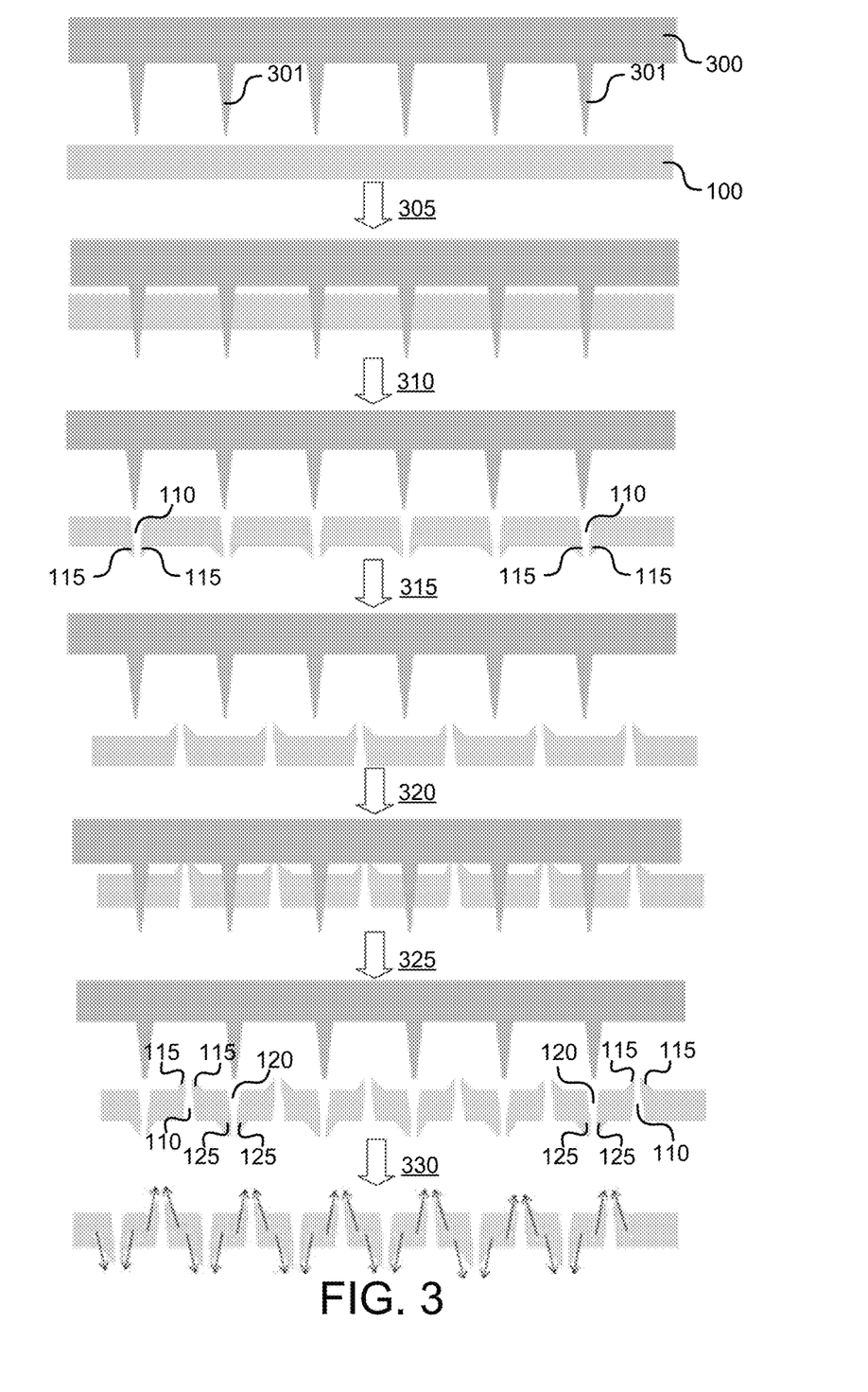
FIG. 3 which depicts one particular process and piercing assembly for processing a graphite sheet, in accordance with implementations of the disclosure.

The sheet of graphite may be perforated using a bed of spikes. For example, FIG. 3 depicts a cross-sectional view of piercing assembly 300 in the form of a bed of spikes 301. At step 305 of FIG. 3, the bed of spikes 301 is used to perforate a graphite sheet 100 from its first surface (facing upward) through its second surface (facing downward). The spikes 301 may comprise nails, pins, tacks, skewers, needles or other structure suitable for perforating the sheet of graphite 100. In the example of FIG. 3, after the graphite sheet 100 is perforated at step 305, at step 310 the piercing assembly 300 is lifted. After liftoff, the perforated graphite sheet 100 includes a plurality of perforations 100. Additionally, a plurality of protrusions 115 form along the second surface of graphite sheet 100 around the perforations 110. The protrusions are oriented outward from the second surface. This orientation increases heat conduction in a direction perpendicular to the second surface of the sheet. In some implementations, a soft layer such as a layer of rubber (e.g., silicone rubber) may be used to support graphite sheet 100 during piercing to prevent damage to spikes 301. It should be noted that although piercing assembly 300 is illustrated as perforating graphite sheet 100 from top to bottom, in other implementations the assembly may be inverted such that the graphite sheet 100 is perforated from bottom to top.

At operation 230, the sheet of graphite is perforated in a second plurality of locations from the second surface through the first surface to form a second plurality of perforations through the sheet and a second plurality of protrusions of graphite material oriented outward from the first surface, wherein the first plurality of protrusions and the second plurality of protrusions are configured to conduct heat away from a plane of the sheet. As the sheet of graphite is perforated in one of the second locations, the graphite may be pushed outward through the first surface to form protrusions.

Referring again to the example of FIG. 3, after the bed of spikes 301 is lifted (step 310), at step 315 the sheet of graphite 100 is flipped over such that the second surface is now facing upward (e.g., is the top surface) and the first surface is facing downward (e.g., is the bottom surface). Additionally, the graphite sheet 100 and/or bed of spikes 301 may be repositioned such that the spikes 301 are oriented between perforations 110. For example, each spike may be approximately halfway between two adjacent perforations 110. Thereafter, at step 320, sheet 100 is perforated a second time by the bed of spikes 301, this time starting from the second surface, and proceeding through the first surface. At step 325, the piercing assembly 300 is lifted. After liftoff, the perforated graphite sheet 100 includes a second plurality of perforations 120. Additionally, a second plurality of protrusions 125 form along the first surface around perforations 120. The protrusions 125 are oriented outward from the first surface. This orientation increases heat conduction in a direction perpendicular to the first surface of the sheet. As such, by virtue of perforating the graphite sheet from both sides to push graphite material, protrusions 115 and 125 pointing away from both surfaces of the sheet are formed. As depicted by the arrows (after step 330) showing a heat conduction direction, the protrusions 115 and 125 enable heat conduction along an axis perpendicular to the plane of the graphite sheet.

Other suitable mechanisms may be used to perforate the graphite sheet at operation 220 and/or operation 230 to form protrusions on both sides of the sheet that conduct heat away from the plane of the sheet. For example, in some implementations the graphite sheet may be perforated using one or more spiked rollers, examples of which are further described below. In other implementations, the graphite sheet may be repeatedly perforated using a linear set of spikes (or bed of spikes) that is actuated up and down as the graphite sheet moves along a conveyer, as the set of spikes moves along the plane of the graphite sheet, and/or some combination thereof. In some implementations, more than one bed of spikes may be used to perforate the graphite sheet. For example, one bed of spikes may perforate the sheet from the top, and another bed of spikes may perforate the sheet from the bottom. It is contemplated that that punch tools may also be used to perforate the graphite sheet.

Although embodiments have thus far been described with reference to piercing the graphite sheet from both sides, it should be noted that thermal conductivity improvement benefits described herein may be realized from piercing the graphite sheet from only one direction. In such instances, operation 230 may be skipped. In some implementations, the graphite sheet is pierced from the second side or direction to further enhance the thermal conductivity improvement.

To maximize a thermal conductivity increase in a direction perpendicular to the plane of the graphite sheet, the location, separation, size, shape, and/or roughness (e.g., around edges of the perforation) of the first plurality of perforations and the second plurality of perforations may be optimized. In some implementations, the techniques described herein may increase the thermal conductivity in the perpendicular direction by up to two times, up to four times, up to five times, up to eight times, up to ten times, or even greater than ten times.

In some implementations, the shape of the twice-pierced graphite sheet may be further stabilized by plating it with a solder such as indium or an indium alloy, or by coating it with a polymer such as a polyacrylate or Poly(methyl methacrylate) (PMMA). Both solder plating or polymer coating may be carried out by dipping the graphite sheet in a solution. The twice-pierced graphite sheet may also be used as a TIM without the solder plating or polymer coating.

Table 1, below, shows the vertical thermal conductivity in W/(m*k) measured at three temperatures for a 48 μm thick graphite film that was perforated manually in several locations, on both sides of the sheet, using a needle. The thermal conductivity measurement was made between a heat source and cold plate cooled by cold water. As illustrated by Table 1, relative to the original, intact graphite film, the perforated graphite film exhibited a significant increase in vertical thermal conductivity at various temperatures, even though the graphite sheet was perforated manually using a needle. At 30° C., a 129% increase in vertical thermal conductivity was observed. At 80° C., a 121% increase in vertical thermal conductivity was observed. At 1200° C., a 101% increase in vertical thermal conductivity was observed.

TABLE 1

| Heat source temperature | Original graphite film | Perforated graphite film |
| --- | --- | --- |
| 30° C. | 0.369 W/(m*k) | 0.846 W/(m*k) |
| 80° C. | 0.401 W/(m*k) | 0.885 W/(m*k) |
| 130° C. | 0.427 W/(m*k) | 0.860 W/(m*k) |

Table 2, below, shows the vertical thermal conductivity measured at three temperatures for a 48 μm thick graphite film that was perforated in several locations, on one side of the sheet, using a bed of nails. The thermal conductivity measurement was made between a heat source and cold plate cooled by cold water. As illustrated in Table 2, relative to the original, intact graphite film, about a ten times increase in thermal conductivity in the vertical direction was observed at temperatures of 30° C. and 80° C. for the perforated graphite film for the side of the sheet with protrusions. About a twenty times increase in thermal conductivity in the vertical direction was observed at a temperatures of 130° C. for the perforated graphite film for the side of the sheet with protrusions. It should be noted that the experiment of Table 2 was conducted one time.

TABLE 2

| Heat source temperature | Original graphite film | Perforated graphite film |
| --- | --- | --- |
| 30° C. | 0.369 W/(m*k) | 3.84 W/(m*k) |
| 80° C. | 0.401 W/(m*k) | 4.16 W/(m*k) |
| 130° C. | 0.427 W/(m*k) | 8.6 W/(m*k) |

Figure 4:
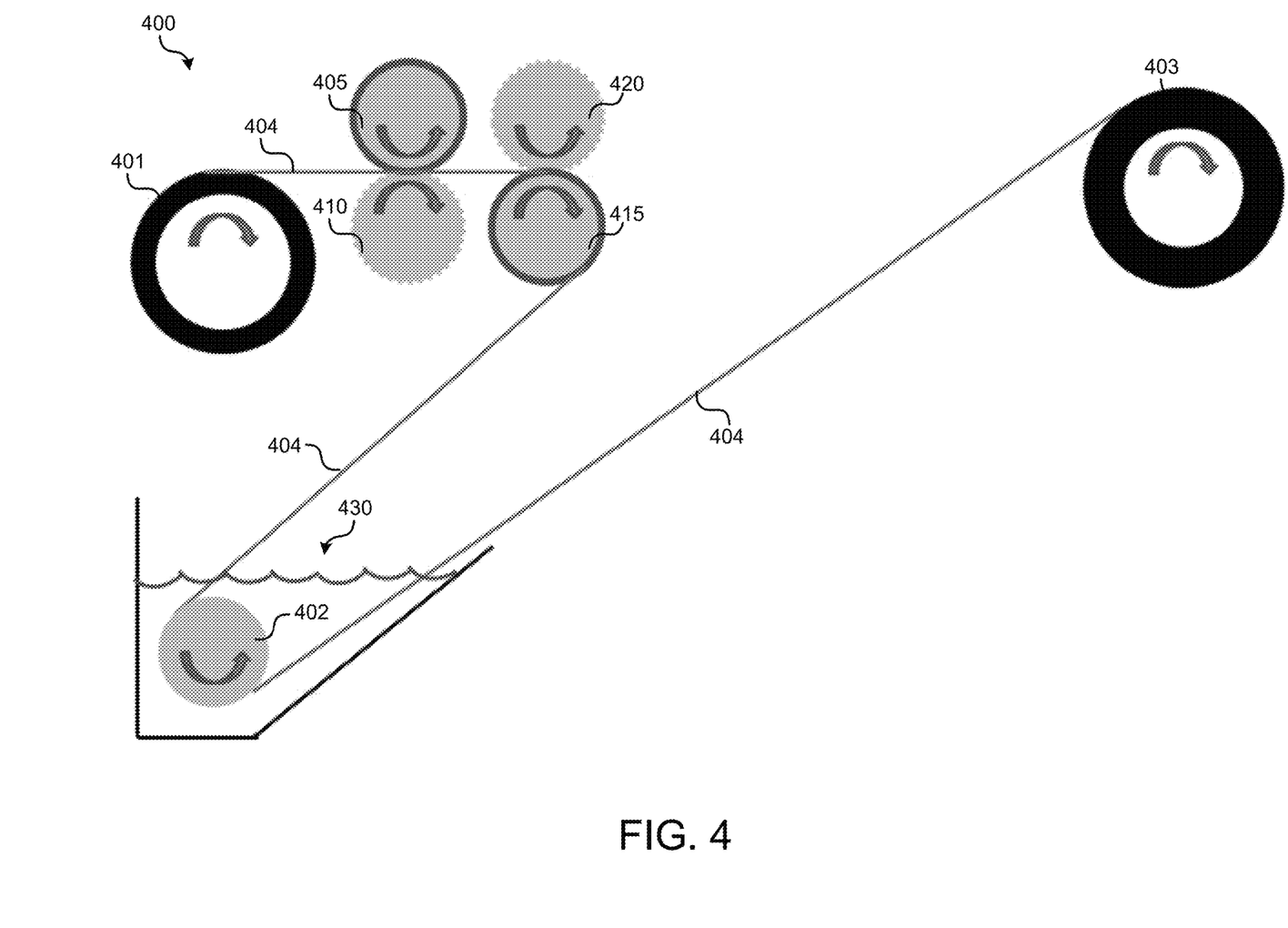
FIG. 4 depicts a system that may be used to manufacture a twice-perforated graphite sheet, in accordance with implementations of the disclosure.

FIG. 4 depicts a system 400 that may be used to manufacture a twice-perforated graphite sheet, in accordance with implementations of the disclosure. In this example, system 400 is a conveyor assembly including pulleys 401, 402, and 403, and a conveyor belt 404 that moves as the pulleys or rollers 401, 402, 403 are rotated. Starting from roller 401, an original, intact graphite sheet moving along conveyor 404 may be perforated from its bottom surface through its top surface by conveying it between spiked roller 410, positioned below the belt 404, and soft roller 405 positioned above the belt 404. The graphite sheet may then be perforated from its top surface through its bottom surface by conveying it between spiked roller 420, positioned above the belt 404, and soft roller 415 positioned below the belt 404.

The spiked rollers 410 and 420 may comprise an array of spikes formed on or coupled to the roller's surface. The smooth rollers 405 and 415 may comprise a roller covered with a soft roller surface such as a rubber layer (e.g., silicone layer). It should be appreciated that the positions of the first roller pair (rollers 405 and 410) and the second roller pair (rollers 415 and 420) may be switched. In either scenario, as the graphite sheet moves along the conveyor, the roller spikes pierce through the graphite film on both sides, forming the protrusions described above.

After the graphite film is twice-perforated, belt 404 conveys it via roller 402 to a bath 430, which may comprise a solder plating (e.g., indium or indium alloy) or polymer solution. In the case of solder plating, after the solder bath, the belt 404 may convey the graphite film to a rinsing mechanism (not illustrated), followed by a drying mechanism (not illustrated), before being collected at roller 403. In the case of polymer coating, after the solder bath, the belt 404 may convey the graphite film to a drying mechanism (not illustrated), followed by a curing mechanism (not illustrated), before being collected at roller 403. In alternative implementations, the perforated graphite film may be used as a TIM without plating or polymer coating.

In alternative implementations where the sheet of graphite is pierced only on one side, spiked roller 420 and smooth roller 415 may not be included in system 400.

Figure 5:
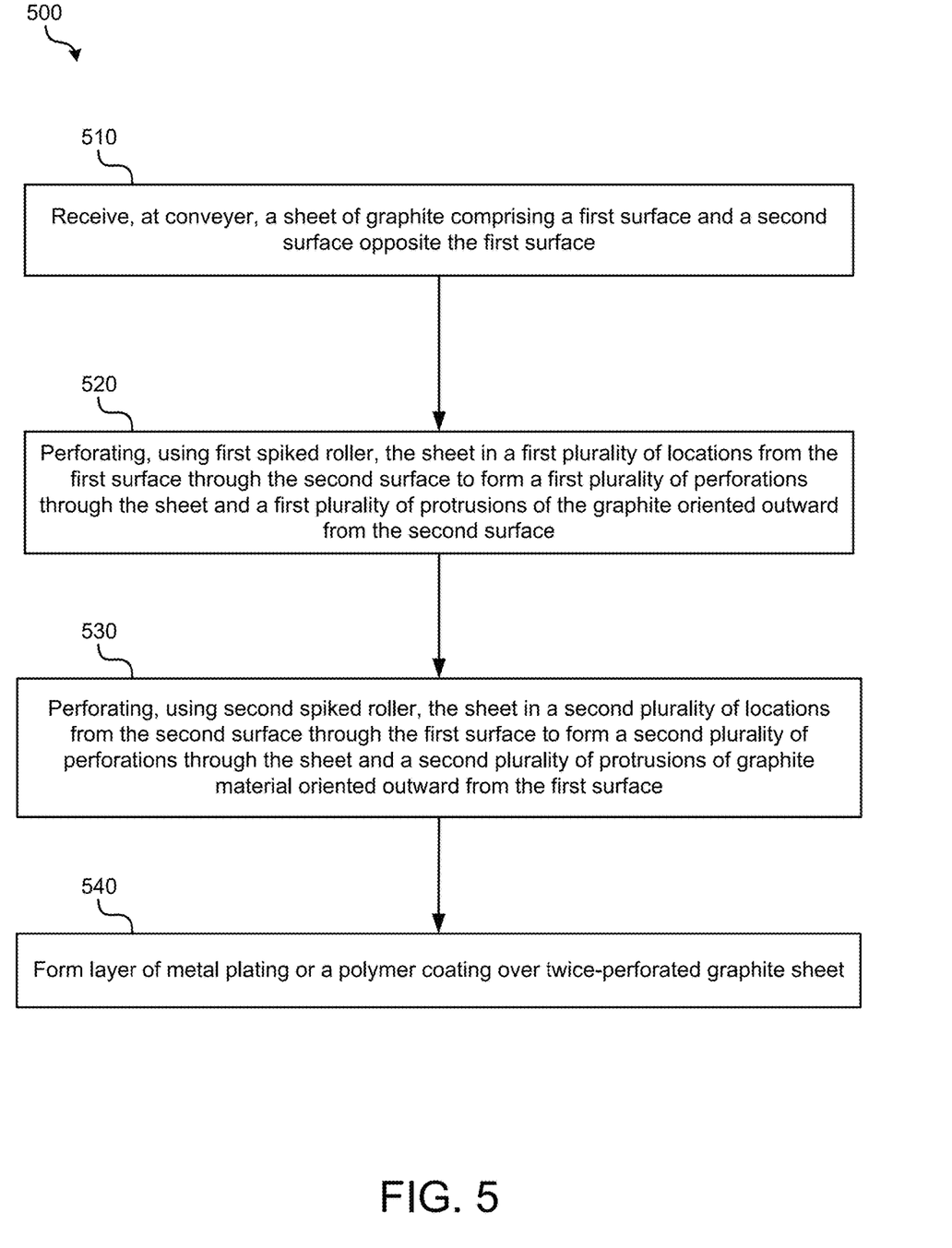
FIG. 5 is an operational flow diagram illustrating example steps of a method of processing a sheet of graphite, in accordance with implementations of the disclosure.

FIG. 5 is an operational flow diagram illustrating example steps of a method 500 of processing a sheet of graphite, in accordance with implementations of the disclosure.

At operation 510, a sheet of graphite is received at a conveyor, the sheet of graphite comprising a first surface (e.g., top surface) and a second surface (e.g., bottom surface) opposite the first surface. For example, the sheet of graphite may be loaded on a conveyor belt 404 prior to processing. Prior to processing, including perforation, the graphite sheet may primarily conduct heat along a plane of the sheet (e.g., as depicted in FIG. 1A).

At operation 520, the sheet of graphite is perforated, using a spiked roller, in a first plurality of locations from the first surface through the second surface to form a first plurality of perforations through the sheet and a first plurality of protrusions of the graphite oriented outward from the second surface. As the sheet of graphite is perforated in one of the first locations, the graphite of that location may be pushed outward through the second surface to form protrusions. For example, the graphite sheet may be conveyed between a soft roller 405 and a spiked roller 410 to form the first plurality of perforations and the first plurality of protrusions.

At operation 530, the sheet of graphite is perforated, using a spiked roller, in a second plurality of locations from the second surface through the first surface to form a second plurality of perforations through the sheet and a second plurality of protrusions of graphite material oriented outward from the first surface, wherein the first plurality of protrusions and the second plurality of protrusions are configured to conduct heat away from a plane of the sheet. As the sheet of graphite is perforated in one of the second locations, the graphite may be pushed outward through the first surface to form protrusions. The spiked roller utilized at operation 530 may be the same as the spiked roller utilized at operation 520. Alternatively, it may be a different spiked roller. For example, the graphite sheet may be conveyed between a soft roller 415 and a spiked roller 420 to form the second plurality of perforations and the second plurality of protrusions.

At operation 540, a layer of metal plating (e.g., solder) or polymer coating is formed over the twice-perforated graphite sheet. In implementations where the layer of metal plating is formed, operation 540 may comprise: placing the sheet of graphite in a bath of the metal, rinsing the sheet after the bath, and drying the sheet. The metal may comprise pure In, InAg alloys, SnAgCu alloys, InSnBi alloys, or some other suitable solder alloy. In implementations where the coating of polymer is formed, operation 540 may comprise: placing the sheet of graphite in a bath of the polymer, drying the sheet after the bath, and curing the polymer.

Figure 6:
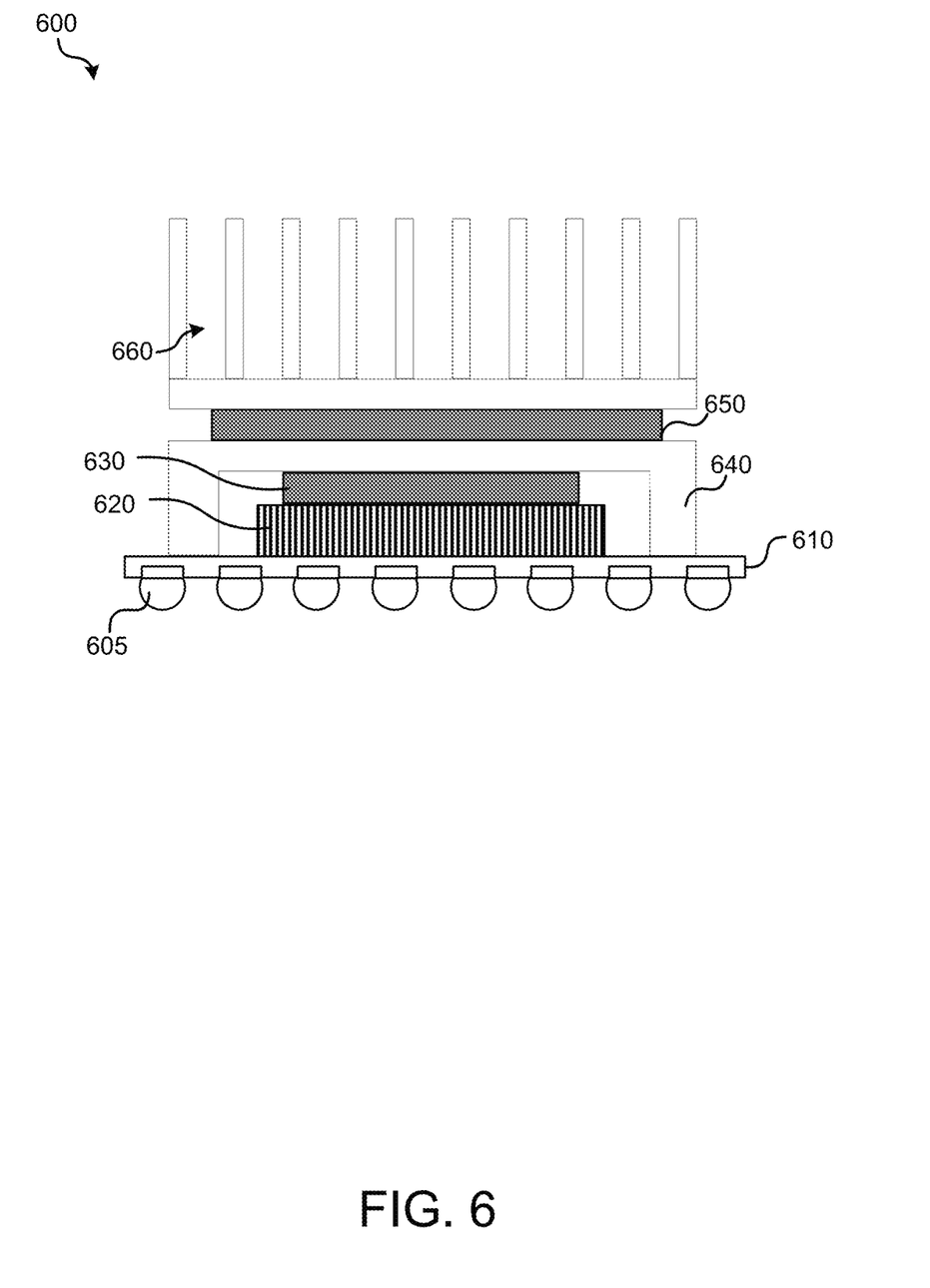
FIG. 6 depicts a cooling setup of a chip carrier, the cooling setup including a TIM in accordance with implementations of the disclosure.

FIG. 6 depicts a cooling setup of a chip carrier 600, the cooling setup including a TIM 630 in accordance with implementations of the disclosure. In this example, the chip carrier 600 is depicted as a ball grid array (BGA) assembly. However, it should be appreciated that the TIM 630 may be utilized to provide a TIM in other chip carriers or surface-mount packaging, including, for example, land grid arrays (LGA), pin grid arrays (PGA), and the like.

As illustrated, chip carrier 600 includes solder balls 605, a substrate 610, a die 620, a TIM 630, a heat spreader 640, a TIM 650, and a heatsink 660. Die 620 may be wire bonded to a top surface of substrate 610 by wire bonds (not shown) and overmolded with a molding compound (not shown) such as an epoxy-based plastic. Attached to a bottom side of substrate 610 is an array of solder balls 605. Each of the solder balls in this example is coupled to a respective pad that may couple to an interconnect (not shown) that electrically couples to die 620. In this manner, electrical signals may be conducted between the die 620 and a PCB onto which chip carrier 600 is placed.

Heat spreader 640 is configured to transfer energy as heat from die 620, via TIM 630, to heat sink 660, via TIM 650. TIM 630 is configured to provide high thermal conductivity and transfer heat generated by die 620 to heat spreader 640. TIM 630 may be a twice-perforated graphite sheet formed in accordance with the techniques described in the present disclosure. TIM 650 is configured to transfer heat from heat spreader 640 to heat sink 660. In some implementations, TIM 650 may also be a twice- perforated graphite sheet formed in accordance with the techniques described in the present disclosure.

As the foregoing examples illustrate, various advantages may be realized by the processes and systems described herein. First, the techniques described herein substantially change the direction of thermal conduction of graphite sheets from along the sheet surface to an axis perpendicular to the sheet surface. Additionally, the method of processing the graphite sheet may be relatively simple, easy to operate, and/or suitable for mass production.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method, comprising:
   receiving a sheet of graphite comprising a first surface and a second surface opposite the first surface;
   perforating the sheet in a first plurality of locations from the first surface through the second surface to form a first plurality of perforations through the sheet and a first plurality of protrusions of the graphite oriented outward from the second surface, wherein the first plurality of perforations are configured to conduct heat away from a plane of the sheet; and after perforating the sheet in the first plurality of locations, plating the sheet with a solder, wherein plating the sheet with the solder, comprises:

placing the sheet of graphite in a bath of the solder;
rinsing the sheet after removing it from the bath; and
drying the sheet after rinsing it.

2. The method of claim 1, wherein perforating the sheet in the first plurality of locations comprises perforating the sheet in the first plurality of locations with a bed of spikes.

3. The method of claim 1, wherein perforating the sheet in the first plurality of locations comprises perforating the sheet in the first plurality of locations with a spiked roller.

4. The method of claim 1, further comprising: perforating the sheet in a second plurality of locations from the second surface through the first surface to form a second plurality of perforations through the sheet and a second plurality of protrusions of graphite material oriented outward from the first surface, wherein the second plurality of protrusions are configured to conduct heat away from the plane of the sheet.

5. The method of claim 4, wherein perforating the sheet in the first plurality of locations comprises perforating the sheet in the first plurality of locations with a bed of spikes; and wherein perforating the sheet in the second plurality of locations comprises perforating the sheet in the second plurality of locations with a bed of spikes.

6. The method of claim 5, wherein the bed of spikes used to perforate the sheet in the first plurality of locations is the same as the bed of spikes used to perforate the sheet in the second plurality of locations.

7. The method of claim 4, wherein perforating the sheet in the first plurality of locations comprises perforating the sheet in the first plurality of locations with a first spiked roller; and wherein perforating the sheet in the second plurality of locations comprises perforating the sheet in the second plurality of locations with a second spiked roller.

8. The method of claim 7, wherein receiving the sheet comprises loading the sheet on a conveyer; wherein perforating the sheet in the first plurality of locations with the first spiked roller comprises conveying the sheet between the first spiked roller and a first non-spiked roller; and wherein perforating the sheet in the second plurality of locations with the second spiked roller comprises conveying the sheet between the second spiked roller and a second non-spiked roller.

9. The method of claim 8, wherein the first non-spiked roller and the second non-spiked roller each comprise a surface rubber layer.

10. A method comprising:

receiving a sheet of graphite comprising a first surface and a second surface opposite the first surface;

perforating the sheet in a first plurality of locations from the first surface through the second surface to form a first plurality of perforations through the sheet and a first plurality of protrusions of the graphite oriented outward from the second surface, wherein the first plurality of perforations are configured to conduct heat away from a plane of the sheet; and after perforating the sheet in the first plurality of locations, coating the sheet in a polymer, wherein coating the sheet in the polymer, comprises:

placing the sheet in a polymer bath;
drying the sheet after removing the sheet from the polymer bath; and
curing the polymer after drying the sheet.

* * * * *